(12) United States Patent
Anthis et al.

(10) Patent No.: US 10,096,514 B2
(45) Date of Patent: Oct. 9, 2018

(54) SEAMLESS TRENCH FILL USING DEPOSITION/ETCH TECHNIQUES

(71) Applicant: Applied Materials, Inc., Santa Clara, CA (US)

(72) Inventors: Jeffrey W. Anthis, San Jose, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/658,846

(22) Filed: Jul. 25, 2017

(65) Prior Publication Data

US 2018/0033689 A1 Feb. 1, 2018

Related U.S. Application Data

(60) Provisional application No. 62/367,606, filed on Jul. 27, 2016.

(51) Int. Cl.
| | | |
|---|---|---|
| *H01L 21/311* | (2006.01) | |
| *H01L 21/768* | (2006.01) | |
| *H01L 23/528* | (2006.01) | |
| *H01L 23/532* | (2006.01) | |

(52) U.S. Cl.
CPC .. *H01L 21/76879* (2013.01); *H01L 21/31105* (2013.01); *H01L 21/76888* (2013.01); *H01L 23/528* (2013.01); *H01L 23/53209* (2013.01)

(58) Field of Classification Search
CPC ......... H01L 21/76888; H01L 21/76879; H01L 21/31105; H01L 23/528; H01L 21/02326; H01L 21/76232; H01L 23/53209
See application file for complete search history.

(56) References Cited

U.S. PATENT DOCUMENTS

| | | |
|---|---|---|
| 6,297,147 B1 | 10/2001 | Yang et al. |
| 6,333,274 B2 | 12/2001 | Akatsu et al. |
| 7,745,305 B2 | 6/2010 | Lee et al. |
| 7,858,492 B2 | 12/2010 | Hong et al. |
| 9,355,886 B2 | 5/2016 | Swaminathan et al. |
| 9,812,319 B1 * | 11/2017 | Fukazawa ........... H01L 21/0228 |
| 2011/0300689 A1 | 12/2011 | Patraw et al. |
| 2013/0210241 A1 | 8/2013 | Lavoie et al. |

FOREIGN PATENT DOCUMENTS

| | | |
|---|---|---|
| KR | 10-2008-0071693 A | 8/2008 |
| KR | 10-2009-0067576 A | 6/2009 |

OTHER PUBLICATIONS

PCT International Search Report and Written Opinion in PCT/US2017/043907 dated Oct. 30, 2017, 10 pages.

* cited by examiner

*Primary Examiner* — Jasmine Clark
(74) *Attorney, Agent, or Firm* — Servilla Whitney LLC

(57) ABSTRACT

Methods for filing a feature on a substrate surface comprising depositing a conformal nitride film on the substrate surface and at least one feature on the surface, oxidizing a portion of the nitride film to form an asymmetric oxide film on top of the nitride film and etching the oxide film from the nitride film to leave a v-shaped nitride film in the at least one feature.

20 Claims, 3 Drawing Sheets

SEAMLESS TRENCH FILL USING DEPOSITION/ETCH TECHNIQUES

CROSS-REFERENCE TO RELATED APPLICATIONS

This application claims priority to U.S. Provisional Application No. 62/367,606, filed Jul. 27, 2016, the entire disclosure of which is hereby incorporated by reference herein.

TECHNICAL FIELD

The present disclosure relates generally to methods of depositing thin films. In particular, the disclosure relates to processes for filling narrow trenches with nitride films.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable films become difficult. Resulting in films with varying composition throughout the filled trench.

Conventional plasma-enhanced chemical vapor deposition (PECVD) of dielectric films form a "mushroom shape" film on top of the narrow trenches. This is due to the inability of the plasma to penetrate into the deep trenches. The results in pinching-off the narrow trench from the top; forming a void at the bottom of the trench.

There are multiple applications that require a technique to fill a gap without leaving a seam. Bottom up gap fills require chemistries that have very high selectivities. Annealing to remove seams can require temperatures higher than the thermal budget.

Therefore, there is a need in the art for methods to fill a gap without leaving a seam.

SUMMARY

One or more embodiments of the disclosure are directed to processing methods comprising providing a substrate surface having at least one feature thereon. The at least one feature extends a depth from the substrate surface to a bottom surface and has a width defined by a first sidewall and a second sidewall. A conformal nitride film is deposited on the substrate surface and the at least one feature. A portion of the nitride film is oxidized to form an asymmetric oxide film on top of the nitride film. The oxide film is etched from the nitride film to leave a v-shaped nitride film in the at least one feature.

Additional embodiments of the disclosure are directed to processing methods comprising providing a substrate surface having at least one feature thereon. The at least one feature extends a depth from the substrate surface to a bottom surface and has a width defined by a first sidewall and a second sidewall. A conformal titanium nitride film is deposited on the substrate surface and the at least one feature. A portion of the titanium nitride film is oxidized to form an asymmetric titanium oxide film on top of the titanium nitride film. The titanium oxide film is etched from the titanium nitride film to leave a v-shaped titanium nitride film in the at least one feature.

Further embodiments of the disclosure are directed to processing methods comprising (a) providing a substrate surface having at least one feature thereon, the at least one feature extending a depth from the substrate surface to a bottom surface, the at least one feature having a width defined by a first sidewall and a second sidewall; (b) depositing a conformal titanium nitride film on the substrate surface and the at least one feature by sequentially exposing the substrate surface to a titanium precursor comprising one or more of tetrakis(dimethylamino) titanium or titanium chloride and a reactant comprising an ammonia plasma; (c) oxidizing a portion of the titanium nitride film by exposing the titanium nitride film to an oxidizing agent comprising one or more of ozone, hydrazine or oxygen plasma to form an asymmetric titanium oxide film on top of the titanium nitride film; (d) etching the titanium oxide film from the titanium nitride film by exposing the titanium oxide film to a metal halide comprising one or more of niobium chloride, niobium fluoride, tungsten fluoride or tungsten chloride to leave a v-shaped titanium nitride film in the at least one feature; and (e) repeating (b)-(d) to fill the at least one feature with substantially no seam.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods to seamlessly fill a trench with a nitride (e.g., titanium nitride) using an atomic layer deposition (ALD) process followed by a pseudo atomic layer etch technique with repeated cycles. Embodiments of the disclosure provide methods of depositing a gap-fill film in high aspect ratio (AR) structures with small dimensions. Some embodiments advantageously provide methods involving cyclic deposition-oxidation-etching processes that can be performed in a cluster tool environment or a multi-section batch processing chamber (e.g., a spatial ALD reactor). Some embodiments advantageously provide seam-free high quality titanium films to fill up high AR trenches with small dimensions. Some embodiments advantageously provide methods to asymmetrically treat and etch conformally deposited films.

Figure 1:
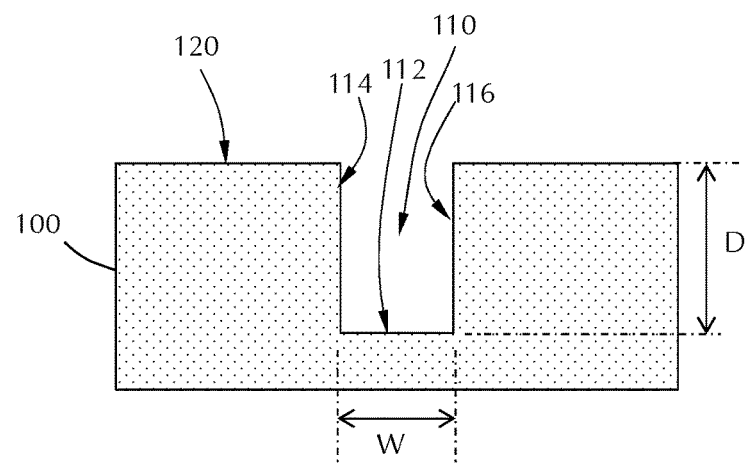
FIG. 1 shows a cross-sectional view of a substrate feature in accordance with one or more embodiment of the disclosure.

For descriptive purposes, the deposition of nitride films for gapfill applications is described. However, those skilled in the art will understand that the precursors and methods described are not limited to gapfill applications and can be used for other films. FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom and vias which have a generally cylindrical sidewall. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

In some embodiments, a thin conformal TiN film may be deposited in a feature using an ALD method (TDMAT/TiCl$_4$ with NH$_3$). The feature may then be treated with an oxidant to generate TiO$_x$ in a non-uniform manner. The treatment is heavier on the horizontal surfaces and heavier at the top of vertical surfaces than at the bottom. The oxidized surfaces may then be etched with a metal halide (MX), which can selectively etch the metal oxide without etching metal, metal nitride, silicon or silicon-based dielectrics. After etching, the resulting TiN feature will have side walls which are thicker at the bottom than at the top generating a v-shape. The steps can be repeated to fill the trench without leaving a seam. A seam is an opening or gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

Figures 2A, 2B:
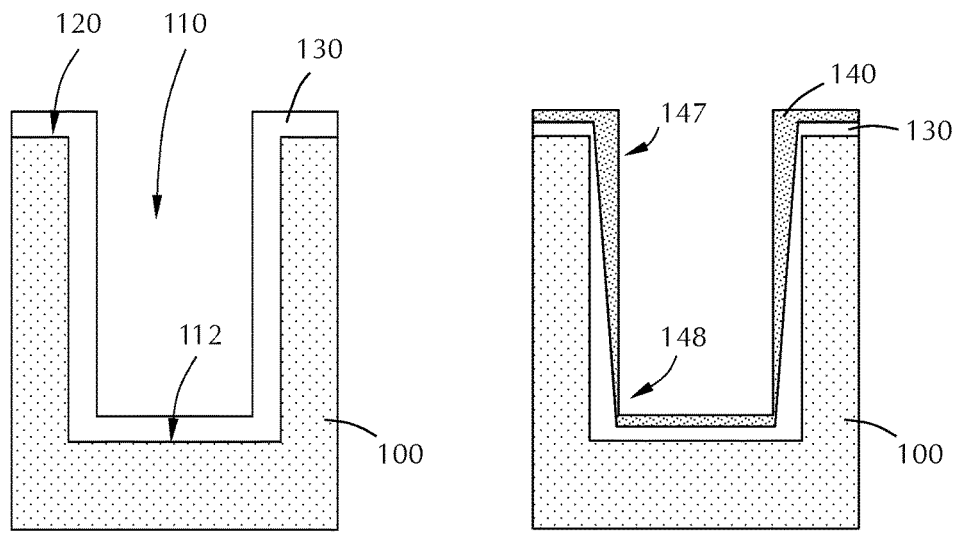
FIGS. 2A through 2J shows a cross-sectional view of a substrate feature and deposited/oxidized/etched films in accordance with one or more embodiment of the disclosure.

FIGS. 2A through 2J illustrate a processing method in accordance with one or more embodiment of the disclosure. In FIG. 2A, a conformal nitride film 130 is deposited on the substrate surface 120 at the at least one feature 110. As used in this manner, the term "conformal" means that the thickness of the film at the sidewall of the feature relative to the top of the feature is greater than or equal to about 85%, or greater than or equal to about 90%, or greater than or equal to about 95%, or greater than or equal to about 96%, or greater than or equal to about 97%.

The nitride film 130 can be deposited by any suitable technique that forms a conformal film. In some embodiments, the conformal nitride film 130 is deposited or formed by an atomic layer deposition (ALD) process. In some embodiments, the ALD process is a plasma-enhanced ALD (PEALD) process.

The nitride film 130 of some embodiments comprises titanium nitride. In one or more embodiments, the nitride film 130 consists essentially of titanium nitride. As used in this manner, the term "consists essentially of" means that the film has greater than or equal to about 85% titanium and nitrogen atoms. The nitride films 130 of some embodiments comprise one or more of silicon, germanium, tantalum, zirconium, hafnium or tungsten. In some embodiments, the nitride film 130 consists essentially of silicon nitride, germanium nitride, tantalum nitride, zirconium nitride, hafnium nitride or tungsten nitride.

In an ALD process, the nitride film 130 is exposed to a metal precursor and a nitrogen reactant in a sequential manner. As used in this manner, "sequential" means in order, and may include repeating exposures in order. In a process to deposit a titanium nitride film, the substrate surface is sequentially exposed to a titanium precursor and a nitrogen reactant.

The titanium precursor of some embodiments comprises a compound having the generic formula Ti(NR$_2$)$_4$, where each R is independently a C1 to C6 alkyl group, or a trimethylsilyl group. In some embodiments, the titanium precursor comprises one or more of tetrakis(dimethylamino) titanium (TDMAT) or titanium tetrachloride (TiCl$_4$). In some embodiments, the titanium precursor comprises a mixture of TDMAT and titanium chloride. In some embodiments, the titanium precursor consists essentially of TDMAT, titanium chloride or a mixture of TDMAT and titanium chloride. As used in this manner, "consists essentially of" means that the reactive titanium species is greater than or equal to about 85% on a weight basis. The precursor can be diluted with an inert species, for example, argon.

The nitrogen reactant can be any suitable species capable of reacting with a metal species on the surface of the substrate to form a nitride. In some embodiments, the nitrogen reactant comprises one or more of oxygen, ozone, hydrazine, NO$_2$, plasmas thereof or combinations thereof. In one or more embodiments, the nitrogen reactant comprises ammonia. In some embodiments, the nitrogen reactant consists essentially of ammonia. As used in this manner, the term "consists essentially of" means that the reactive species of the nitrogen reactant comprises greater than or equal to about 85% ammonia on a weight percent basis. In some embodiments, the ammonia is diluted in an inert species, for example, argon.

In one or more embodiments, the nitrogen reactant comprises a nitriding plasma, for example, a plasma of ammonia.

The plasma can be generated or ignited within the processing chamber (e.g., a direct plasma) or can be generated outside of the processing chamber and flowed into the processing chamber (e.g., a remote plasma).

As shown in FIG. 2B, after deposition of the nitride film 130, an asymmetric oxide layer 140 is formed on top of the nitride film 130. The asymmetric oxide layer 140 is thicker near the top 147 of the sidewall than at the bottom 148 of the sidewall. The oxide film 140 can be formed on top of the nitride film 130 by any suitable non-conformal technique. As used in this manner "formed on top of" means that the film is either deposited onto and existing film, or made from the existing film. For example, the top of the nitride film can be converted to an oxide film so that there is a portion of the nitride film remaining below the converted oxide film.

In some embodiments, oxidizing the portion of the nitride film 130 comprises exposing the nitride film 130 to one or more of ozone, hydrazine and an oxygen plasma. In one or more embodiments, the nitride film 130 is exposed to an oxygen plasma to convert a portion of the nitride film 130 to an oxide film 140.

Figure 2C:
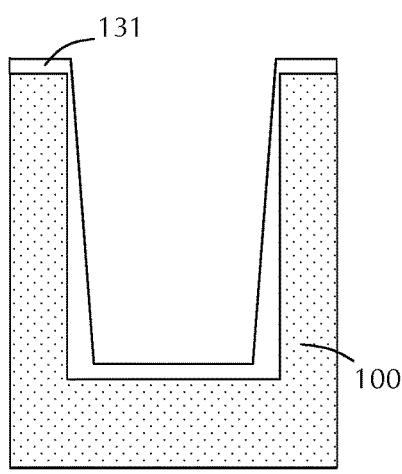

The oxide film 140 is etched from the nitride film 130 to leave a v-shaped nitride film 131 in the at least one feature. As used in this manner, the term "v-shaped" means that the sides of the film lean outward at the top relative to the bottom. A v-shaped film can have a flat bottom like that shown in FIG. 2B or come to a point like that shown in FIG. 2J. FIG. 2C shows the v-shaped nitride film 131 resulting after etching the oxide film 140.

The oxide film 140 can be etched by any suitable technique. In some embodiments, etching the oxide film 140 comprises exposing the oxide film 140 to a metal halide. Suitable metal halides include, but are not limited to, niobium chloride, niobium fluoride, tungsten fluoride and tungsten chloride. In some embodiments, the metal halide is one or more of niobium chloride, niobium fluoride, tungsten fluoride or tungsten chloride.

Figure 2D:
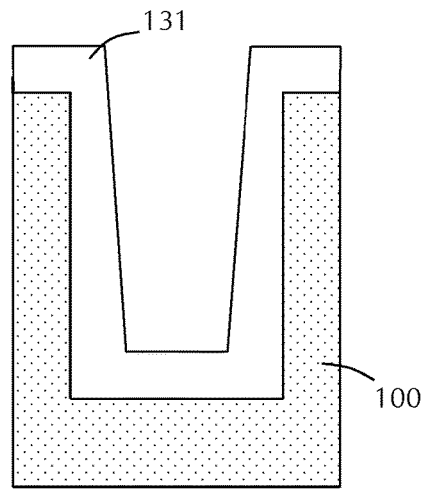
Figure 2E:
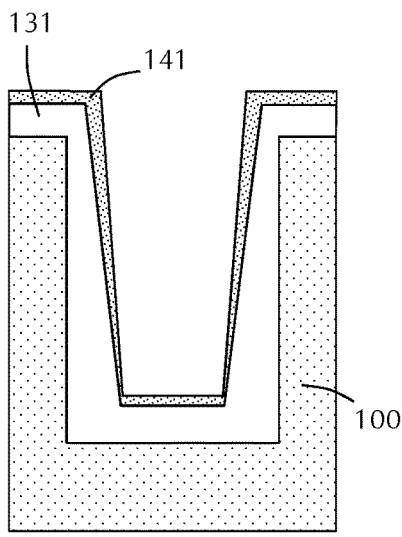
Figure 2F:
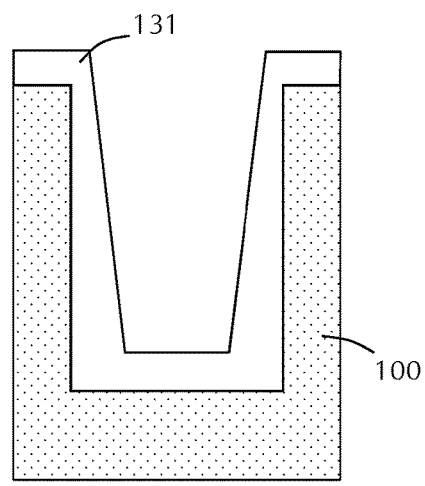
Figure 2G:
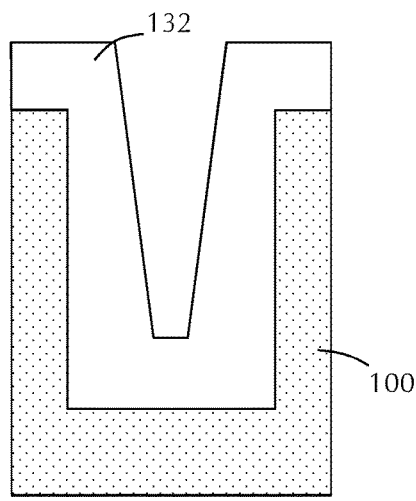
Figure 2H:
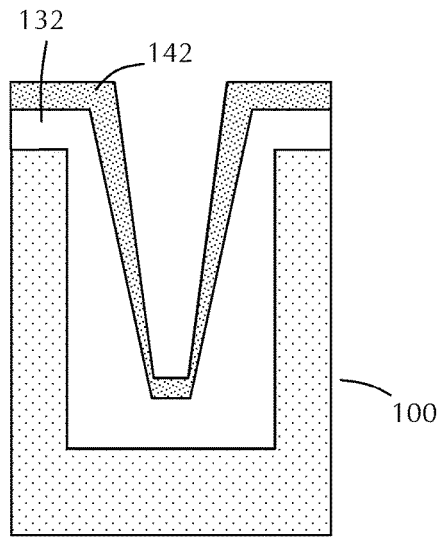
Figure 2I:
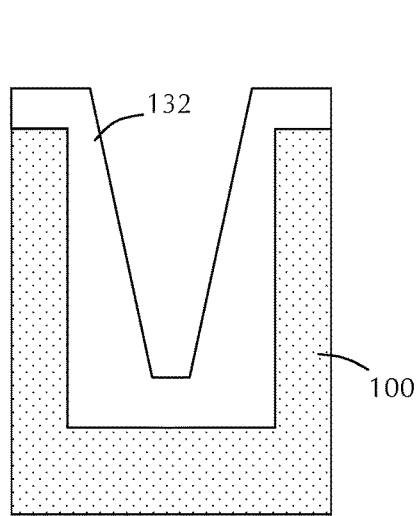
Figure 2J:
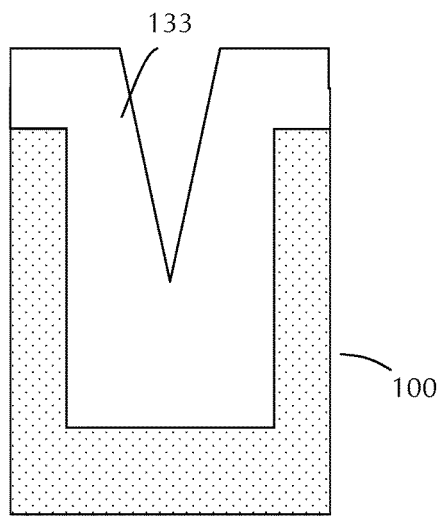

The deposition, oxidation and etching processes can be sequentially repeated to fill the feature. FIG. 2D shows a nitride film 131 deposited on the post-etching film of FIG. 2C to form a nitride film 131 of a combined thickness that is greater than the thickness prior to deposition. A portion of the nitride film 131 can be oxidized in an asymmetric manner, as shown in FIG. 2E. It can be seen from FIG. 2E that the oxide film 141 is v-shaped and the sides of the oxide film 141 have a steeper slope than the previous nitride film 131. Etching the oxide film 141 results in a nitride film 131, as shown in FIG. 2F, with the steeper slope. The nitride film 131 in FIG. 2F has a steeper slope than the nitride film in FIG. 2C. FIGS. 2G through 2I show the deposition of a nitride film 132 (FIG. 2G), oxidation of the nitride file 132 to form the oxide film 142 (FIG. 2H) and etching of the oxide film 142 to form nitride film 132 (FIG. 2I). In FIG. 2J, the nitride film 133 is shown after one or more cycles of deposition/oxidation/etching to fill the at least one feature with the nitride film 133 to form a nitride gapfill.

In some embodiments, the nitride film is doped with another element. For example, some nitride films may be doped with one or more of B, As or P. The nitride films can be doped with elements such as boron (B) and phosphorous (P) to improve film properties. Precursors containing boron and phosphorous can be either co-flown with Si-containing precursors during the deposition process or can be infiltrated after the deposition is done. Boron containing precursors can be aminoboranes/boranes compounds and phosphorous containing precursors can be phosphate/phosphite compounds. In some embodiments, doping the film comprises co-flowing a dopant precursor with the metal precursor (e.g., the titanium precursor). In some embodiments, doping the film comprises implantation of the dopant element in a separate process.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
    providing a substrate surface having at least one feature thereon, the at least one feature extending a depth from the substrate surface to a bottom surface, the at least one feature having a width defined by a first sidewall and a second sidewall;
    depositing a conformal nitride film on the substrate surface and the at least one feature;
    oxidizing a portion of the nitride film to form an asymmetric oxide film on top of the nitride film; and
    etching the oxide film from the nitride film to leave a v-shaped nitride film in the at least one feature.

2. The processing method of claim 1, further comprising repeating the depositing, oxidizing and etching processes to fill the at least one feature with the nitride film to form a nitride gapfill.

3. The processing method of claim 2, wherein the at least one feature has substantially no seam in the nitride gapfill.

4. The processing method of claim 2, wherein the nitride film comprises a titanium nitride film.

5. The processing method of claim 4, wherein depositing the titanium nitride film comprises sequentially exposing the substrate surface to a titanium precursor and a nitrogen reactant.

6. The processing method of claim 5, wherein the titanium precursor comprise a compound with the general formula $Ti(NR_2)_4$, where each R is independently selected from the group consisting of C1-C6 alkyl and trimethylsilyl.

7. The processing method of claim 6, wherein the titanium precursor comprises one or more of tetrakis(dimethylamino) titanium or titanium chloride.

8. The processing method of claim 6, wherein the nitrogen reactant comprises one or more of hydrazine or ammonia.

9. The processing method of claim 8, wherein the nitrogen reactant comprises an ammonia plasma.

10. The processing method of claim 2, wherein oxidizing the portion of the nitride film comprises exposing the nitride film to one or more of $O_2$, ozone, or plasmas thereof.

11. The processing method of claim 2, wherein etching the oxide film comprises exposing the oxide film to a metal halide.

12. The processing method of claim 11, wherein the metal halide comprises one or more of niobium chloride, niobium fluoride, tungsten fluoride or tungsten chloride.

13. A processing method comprising:
    providing a substrate surface having at least one feature thereon, the at least one feature extending a depth from the substrate surface to a bottom surface, the at least one feature having a width defined by a first sidewall and a second sidewall;
    depositing a conformal titanium nitride film on the substrate surface and the at least one feature;
    oxidizing a portion of the titanium nitride film to form an asymmetric titanium oxide film on top of the titanium nitride film; and
    etching the titanium oxide film from the titanium nitride film to leave a v-shaped titanium nitride film in the at least one feature.

14. The processing method of claim 13, further comprising repeating the depositing, oxidizing and etching processes to fill the at least one feature with the titanium nitride film to form a titanium nitride gapfill.

15. The processing method of claim 14, wherein the at least one feature has substantially no seam in the titanium nitride gapfill.

16. The processing method of claim 14, wherein depositing the titanium nitride film comprises sequentially exposing the substrate surface to a titanium precursor and a nitrogen reactant.

17. The processing method of claim 16, wherein the titanium precursor comprises one or more of tetrakis(dimethylamino)titanium or titanium chloride and the nitrogen reactant comprises one or more of hydrazine or an ammonia plasma.

18. The processing method of claim 14, wherein oxidizing the portion of the titanium nitride film comprises exposing the titanium nitride film to one or more of oxygen, ozone, an oxygen plasma or an ozone plasma.

19. The processing method of claim 14, wherein etching the oxide film comprises exposing the oxide film to a metal halide comprising one or more of niobium chloride, niobium fluoride, tungsten fluoride or tungsten chloride.

20. A processing method comprising:
(a) providing a substrate surface having at least one feature thereon, the at least one feature extending a depth from the substrate surface to a bottom surface, the at least one feature having a width defined by a first sidewall and a second sidewall;
(b) depositing a conformal titanium nitride film on the substrate surface and the at least one feature by sequentially exposing the substrate surface to a titanium precursor comprising one or more of tetrakis(dimethylamino) titanium or titanium chloride and a reactant comprising an ammonia plasma;
(c) oxidizing a portion of the titanium nitride film by exposing the titanium nitride film to an oxidizing agent comprising one or more of ozone, hydrazine or oxygen plasma to form an asymmetric titanium oxide film on top of the titanium nitride film;
(d) etching the titanium oxide film from the titanium nitride film by exposing the titanium oxide film to a metal halide comprising one or more of niobium chloride, niobium fluoride, tungsten fluoride or tungsten chloride to leave a v-shaped titanium nitride film in the at least one feature; and
(e) repeating (b)-(d) to fill the at least one feature with substantially no seam.

* * * * *